United States Patent
Sakamoto

(10) Patent No.: US 7,250,327 B2
(45) Date of Patent: Jul. 31, 2007

(54) SILICON DIE SUBSTRATE MANUFACTURING PROCESS AND SILICON DIE SUBSTRATE WITH INTEGRATED COOLING MECHANISM

(75) Inventor: Shinichi Sakamoto, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 211 days.

(21) Appl. No.: 10/883,452

(22) Filed: Jun. 30, 2004

(65) Prior Publication Data

US 2006/0001153 A1    Jan. 5, 2006

(51) Int. Cl.
H01L 21/44    (2006.01)
H01L 21/302   (2006.01)

(52) U.S. Cl. ............... 438/106; 438/122; 438/135; 438/689; 438/637; 257/706; 257/712; 257/737; 257/774; 257/777

(58) Field of Classification Search ........ 257/706, 257/712, 717, 722, E31.131, E23.051, 737, 257/774, 777; 438/122, 125, 106, 689, 637
See application file for complete search history.

(56) References Cited

U.S. PATENT DOCUMENTS

| | | | |
|---|---|---|---|
| 5,724,818 A | 3/1998 | Iwata et al. | |
| 6,222,113 B1 | 4/2001 | Ghoshal | |
| 6,408,937 B1 | 6/2002 | Roy | |
| 6,586,835 B1 | 7/2003 | Ahn et al. | |
| 6,588,217 B2 | 7/2003 | Ghoshal | |
| 6,613,602 B2 | 9/2003 | Cooper et al. | |
| 6,614,109 B2 | 9/2003 | Cordes et al. | |
| 6,727,423 B2* | 4/2004 | Tauchi et al. | 136/201 |
| 6,787,896 B1* | 9/2004 | Petty-Weeks | 257/700 |
| 6,942,018 B2 | 9/2005 | Goodson et al. | |
| 6,981,380 B2 | 1/2006 | Chrysler et al. | |
| 2005/0085075 A1 | 4/2005 | Shimada et al. | |

* cited by examiner

Primary Examiner—Jerome Jackson
Assistant Examiner—Joseph Nguyen
(74) Attorney, Agent, or Firm—Pearl Cohen Zedek Latzer, LLP

(57) ABSTRACT

In one embodiment a method is provided. The method comprises inserting a first end of a P-type semiconductor pin in a first through hole via in a substrate; inserting a first end of an N-type semiconductor pin in a second through hole via in the substrate; and electrically connecting the first ends of the P and N-type semiconductor pins to form a precursor Peltier cooling device which in cooperation with a semiconductor die, bridges the P and N-type semiconductor pins between their ends remote from the first ends to define a Peltier cooling device in the substrate.

15 Claims, 5 Drawing Sheets

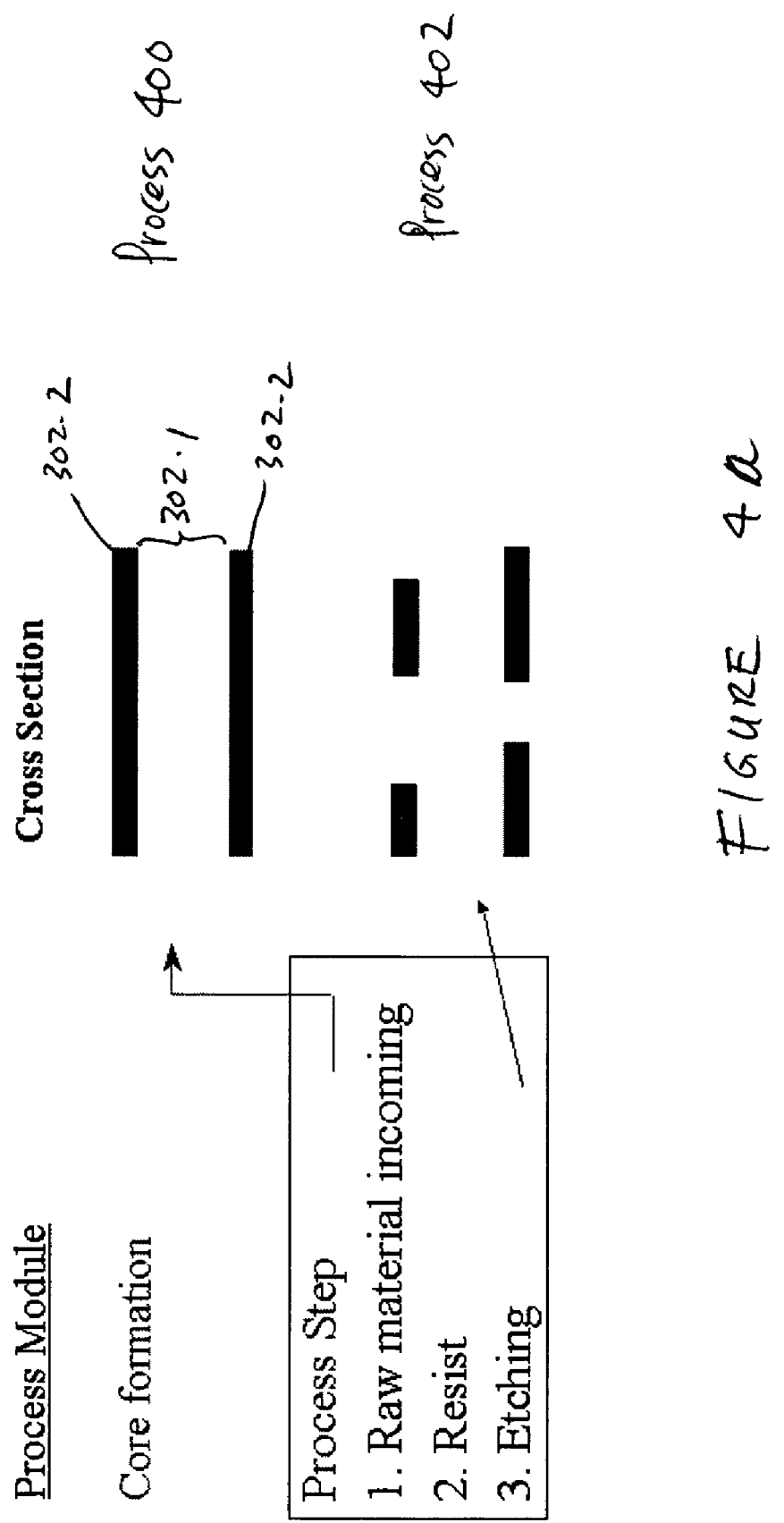

US 7,250,327 B2

SILICON DIE SUBSTRATE MANUFACTURING PROCESS AND SILICON DIE SUBSTRATE WITH INTEGRATED COOLING MECHANISM

FIELD OF THE INVENTION

Embodiments of the invention relate to the fabrication of substrates to which semiconductor dies are attachable.

BACKGROUND

A semiconductor die typically generates a significant amount of heat and is required to be cooled for reliable operation. Existing cooling techniques are limited to the removal of heat through a back side of the semiconductor die. For example, a heat sink or a fan may be mounted to the back side of the die in order to remove heat. However, most of the heat is generated at a circuit side of the semiconductor die which is remote from the back side and because of thermal resistance between the circuit side and the back side, the effectiveness of cooling by heat removal through the back side of the semiconductor die is reduced.

FIG. 1 of the drawings shows a semiconductor package 100 which includes a cooling mechanism that is illustrative of the above-described cooling techniques. Referring to FIG. 1, the semiconductor package 100 includes a semiconductor die 102 which is bonded to a substrate 104 by a plurality of conductive bumps 108. The semiconductor die 102 includes a back side 102.1 and a circuit side 102.2. Mounted to the back side 102.1 is a heat sink 106 which includes a plurality of thermal fins 106.1. Typically, the heat sink 106 is of a conductive material which operates to draw heat by conduction from the semiconductor die 102 and to radiate the heat through the fins 106.1. It will be appreciated that the larger the surface area of the fins 106.1, and the larger the area of the heat sink 106 that is in contact with the semiconductor die 102, the more effective the cooling. Accordingly, as semiconductor dies reduce in size, the effectiveness of cooling by mounting heat sinks to a back side of a semiconductor die is reduced, since the available semiconductor die back side area is reduced.

BRIEF DESCRIPTION OF THE DRAWINGS

FIGS. 4a and 4b illustrate process steps in the fabrication of the substrate of FIG. 3, in accordance with one embodiment of the invention.

DETAILED DESCRIPTION

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1:
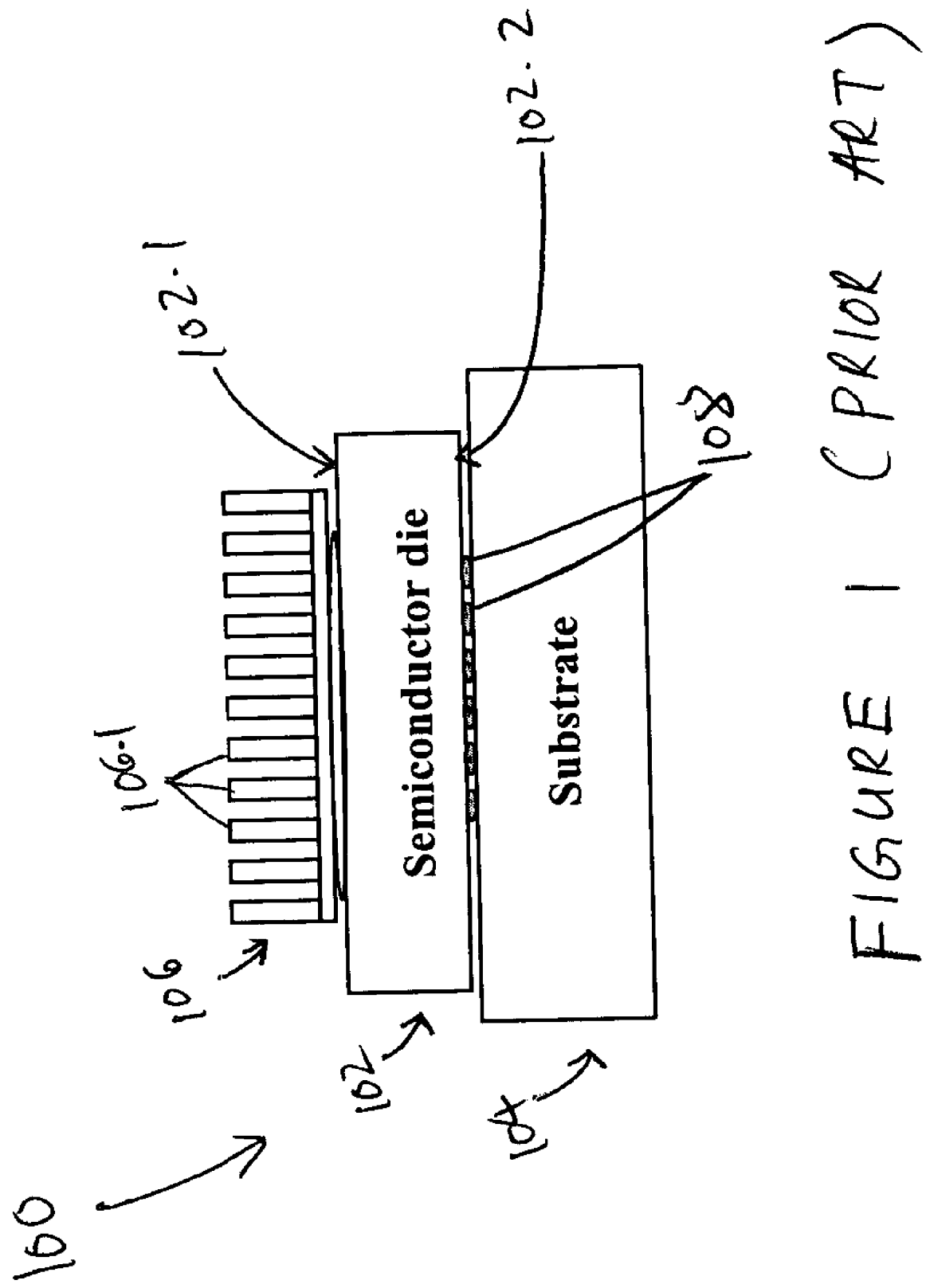
FIG. 1 shows a high level block diagram of a semiconductor package, with a heat sink mounted on a back side of a semiconductor die, in accordance with the prior art.
Figure 2:
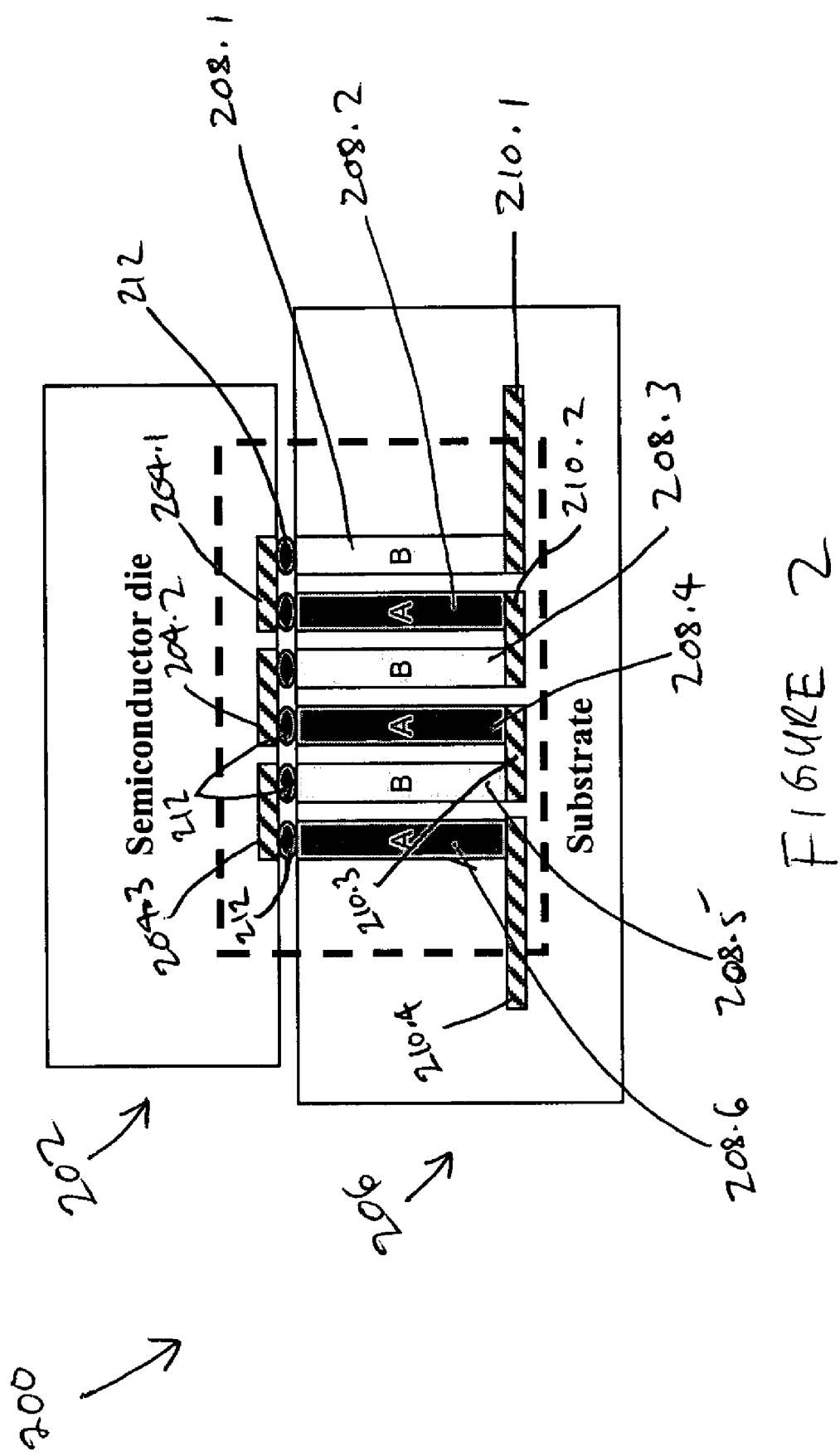
FIG. 2 shows a high level block diagram of a semiconductor package in which a substrate and a semiconductor die in cooperation define a Peltier cooling device, in accordance with one embodiment of the invention.

FIG. 2 of the drawings shows a high-level block diagram of a semiconductor package 200, in accordance with one embodiment of the invention. Referring to FIG. 2, it will be seen that the package 200 comprises a semiconductor die 202 which is mounted or attached to a substrate 206. The semiconductor die 202 includes a plurality of conductive regions, only three of which have been shown in FIG. 2 of the drawings, in which they have been indicted by reference numerals 204.1, 204.2, and 204.3. The substrate 206 includes a plurality of vias or through holes, only six of which have been shown in FIG. 2 of the drawings, where they are indicated by reference numerals 208.1 to 208.6. The vias 208.2, 208.4, and 208.6 includes a material of a first type designated by "A", whereas the vias 208.1, 208.3, and 208.5 include material of a second type designated by "B". The substrate 206 also includes a metallization layer which has been patterned into separate regions designated as 210.1, 210.2, 210.3, and 210.4 in FIG. 2 of the drawings. Electrical connection between the semiconductor die 202 and the substrate 206 is achieved by connection elements 212, which in accordance with some embodiments of the invention, may include conductive bumps. The material A, and the material B used in the vias 208.1 to 208.6 are selected so that each of the adjacent pairs of vias effectively function as a thermoelectric couple when the substrate 206 is electrically connected to the semiconductor die 202 using the connection elements 212. Thus, referring to FIG. 2 of the drawings, the vias 208.1, and 208.2 define a thermoelectric couple in which current flows from the material B in the via 208.1 to the material A in the via 208.2 through an electrical path external to the substrate 206 provided by two of the electrical connection elements 212 and the conductive region 204.1 of the semiconductor die 202. The vias 208.2 and 208.3 define a thermoelectric couple in which current flows from the material A in the via 208.2 through the metallization region 210.2 and into the material B of the via 208.3. The vias 208.3, and 208.4 define a thermoelectric couple in which current flows from the material B in via 208.3 through the external electrical path provided by two of the electrical connection elements 212 and the conductive region 204.2 into the material A in the via 208.4. The vias 208.4, and 208.5 also act as a thermoelectric couple in which current flows from the material A in via 208.4 through the metallization 210.3 into the material B of via 208.5. Finally, the vias 208.5, and 208.6 act as a thermoelectric couple, in which current flows from the material B in via 208.5 through the external current path provided by two of the electrical connection elements 212, and the conductive region 204.3 into the material A in the via 208.6. In one embodiment, the material of type A may be a P-type metal or semiconductor, whereas the material of type B may be an N-type metal or semiconductor. Since the vias 208.1 to 208.6 act as thermoelectric couples, as described, it will be appreciated that the vias 208.1 to 208.2 which are filled with the material of type A, or the material of type B, as described above, acts as a Peltier cooling device in that they transport heat produced at a circuit side of the semiconductor chip 202 into the substrate 206 for dissipation through the substrate 206. Since the vias 208.1 to 208.6 with their respective A, or B type materials in cooperation or combination with the semiconductor chip 202 functions as a Peltier cooling device, as described, it will be appreciated that vias 208.1 to 208.6, each filled with its respective A, or B type material, defines a precursor Peltier cooling device. Thus, embodiments of the present invention disclose techniques for forming a substrate, such as the substrate 206 with an embedded precursor Peltier device, which in cooperation or combination with a semiconductor die, such as the die 202 described with reference to FIG. 2, forms a Peltier cooling device.

Figure 3:
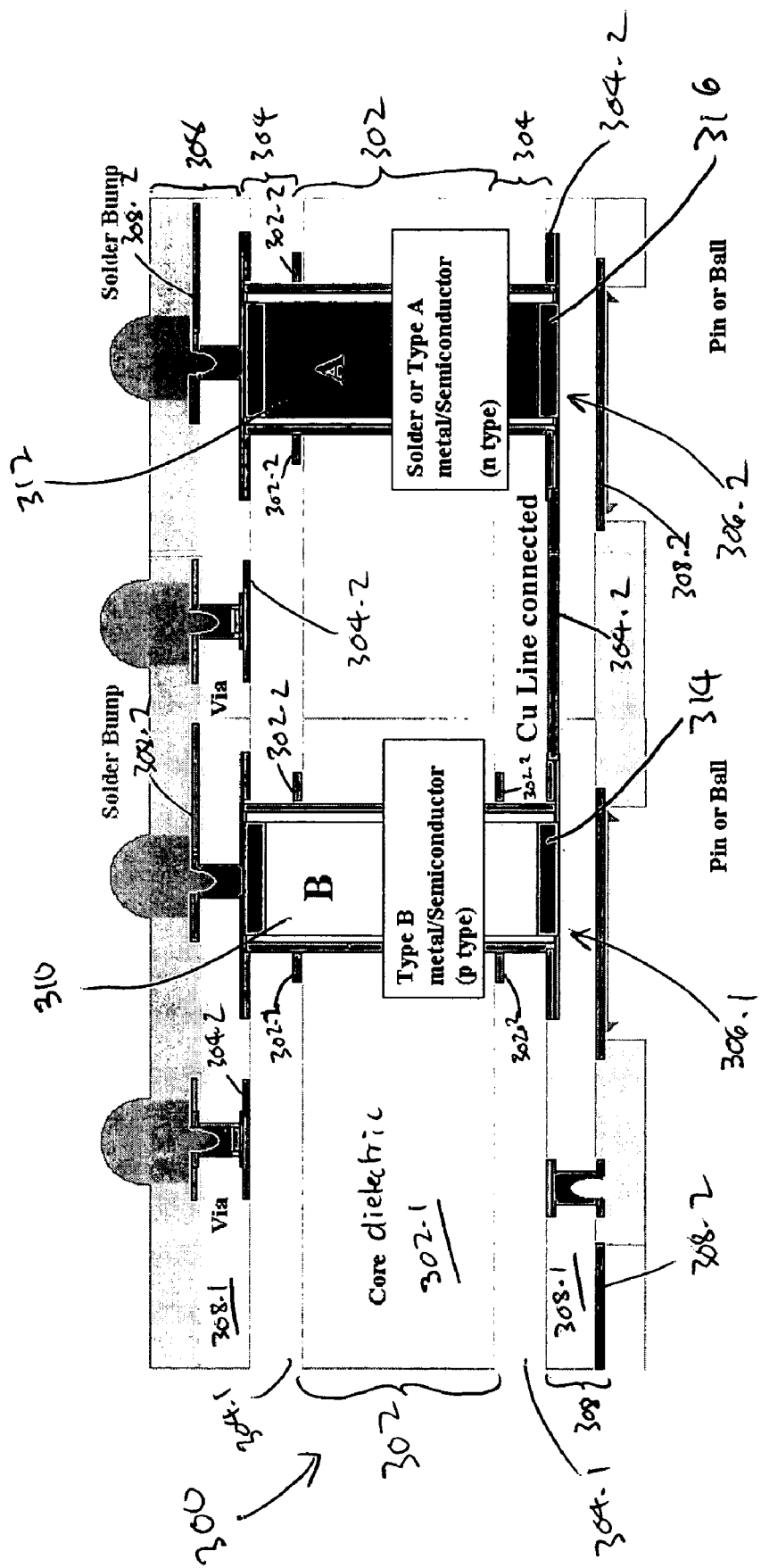
FIG. 3 shows an example of a substrate which includes an embedded precursor Peltier cooling device, in accordance with one embodiment of the invention, in greater detail.

FIG. 3 of the drawings shows an example of a substrate 300 which includes an embedded precursor Peltier cooling device, in accordance with one embodiment of the invention, in greater detail. Referring to FIG. 3, it will be seen that the substrate 300 includes a core 302. The core 302 includes a core dielectric 302.1. The core 302 also includes a patterned metallization layer 302.2. On either side of the core 302 there is a first build-up formation 304 that includes an insulator layer 304.1, and a patterned metallization layer 304.2. The substrate 300 includes a plurality of vias that extend through the core 302 and the first build-up formations 304. In FIG. 3 of the drawings, only two of these vias have been shown, and are indicated by reference numerals 306.1 and 306.2. The substrate 300 also includes second build-up formations 308. Each second build-up formation 308 includes an insulator layer 308.1 and a patterned metallization layer 308.2. The vias 306.1, and 306.2 serve to connect the internal metallization layers of the core with the metallization layers of the first and second buildup formations. In the prior art, the vias 306.1 and 306.2 are generally filled with a plugging material such as resin, to prevent wicking of solder through the vias 306.1, and 306.2. In accordance with one embodiment of the present invention, the via 306.1 is filled with a type B material, and the via 306.2 is filled with a type A material. For example, the via 306.1 may be filled with a P-type metal or semiconductor, whereas the via 306.2 may be filled with an N-type metal or semiconductor. In one embodiment, the material that is used to fill the vias 306.1, and 306.2 may be preformed into cylindrical pins that are inserted into the vias 306.1, and 306.2. In FIG. 3 of the drawings, a cylindrical pin 310 of a P-type metal/semiconductor is inserted into the via 306.1, and a cyclindrical pin 312 of an N-type metal/semiconductor material is inserted into the via 306.2. In one embodiment, gaps between the pins 310, 312 and an inner wall of the vias 306.1, and 306.2, respectively, are filled with a plugging material such as resin, in order to secure the pins 310, 312 in their respective vias. The pins 310, and 312 are fabricated of materials that have a high Peltier coefficient. For example, in one embodiment, the pin 310 is fabricated of a bismuth-telluride-selenium (BiTeSe) compound, and the pin 312 is fabricated of a bismuth-telluride-antimony (BiTeSb) compound. The pins may be formed by a grinding/crushing process to mix the materials of the compound, followed by a hot isostatic press process for sintering. Referring again to FIG. 3 of the drawings, it will be seen that at the bottom of the via 306.1 there is a metallization layer 314, and at the bottom of the via 306.2 there is a metallization layer 316. The metallization layers 314 and 316 serve to achieve good ohmic contact between the metallization layer 304.2 and each of the pins 310, and 312, respectively.

Figure 4B:
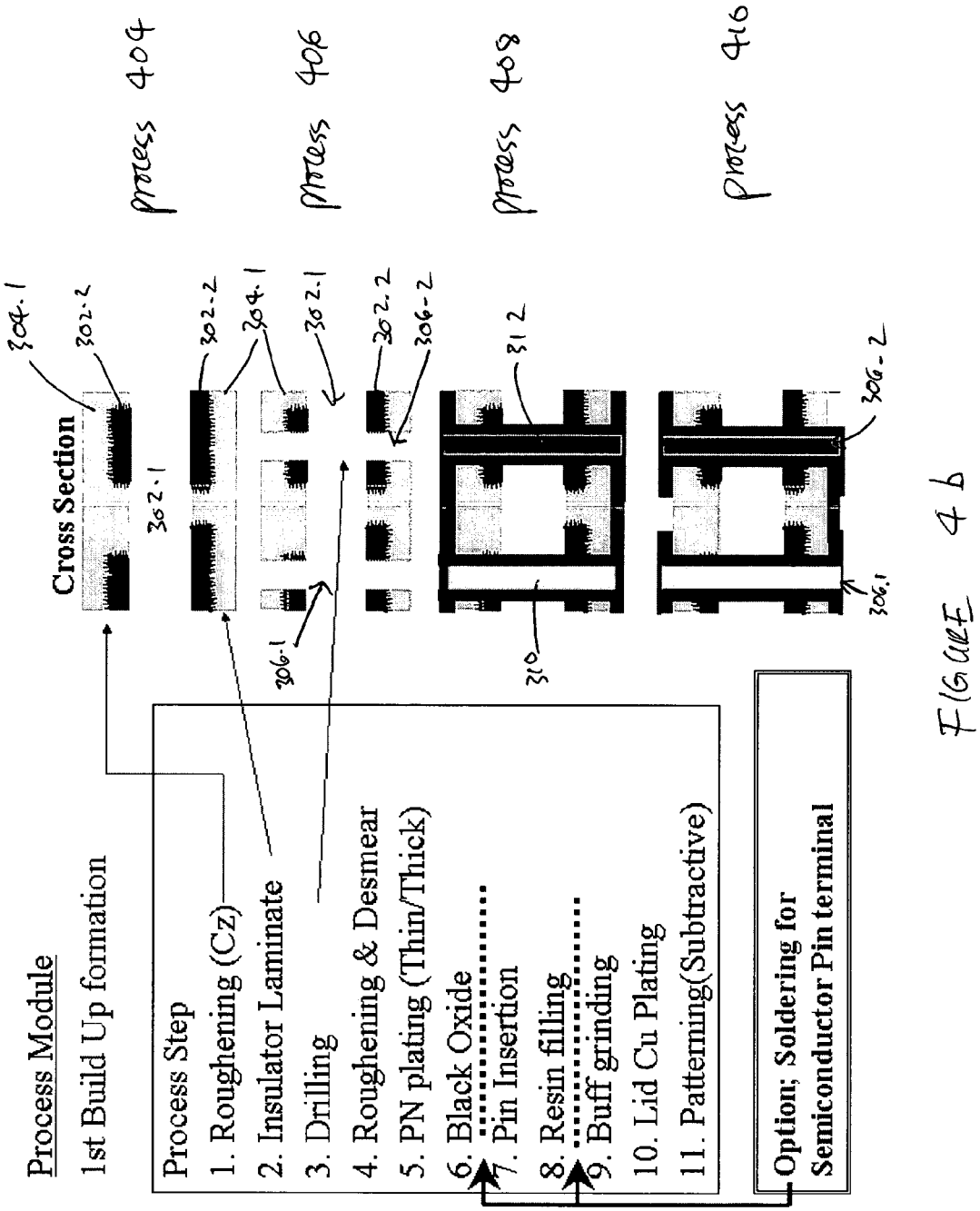

FIGS. 4a and 4b of the drawings illustrate a buildup sequence to fabricate the substrate 300 of FIG. 3, in accordance with one embodiment of the invention. Referring to FIG. 4a, the steps involved in the formation of the core 302 is illustrated. Referring to FIG. 4a of the drawings, in process 400 the core 302 is formed. The core 302 comprises a core dielectric 302.1 sandwiched between two metallization layers 302.2. In process 402, the metallization layers 302.2 are patterned so that certain sections of the metallization layers 302.2 are removed.

FIG. 4b of the drawings shows a process sequence to build the first-buildup formations 304 of FIG. 3. Referring to FIG. 4b, in process 404 the metallization layers 302.2 are roughened. Thereafter, an insulator laminate 304.1 is deposited on either side of the core 302. The purpose of roughening the metallization layer 302.2 is to promote good adhesion between the metallization layer and the insulator layers 304.1. In one embodiment, in order to roughen the metallization layers 302.2, a chemical etching technology is used using a solvent eg. Cz. The chemical etching may be performed at a temperature of about 25° C. Alternatively, an electrical roughening process may be used.

In process 406, the vias 306.1, and 306.2 are formed. In one embodiment, the vias 306.1, and 306.2 are formed by drilling. In one embodiment, the vias 306.1, and 306.2 may have a diameter of 300 μm. The process 406 also includes chemically roughening the insulator laminate layers 304.1. After the insulator laminate surfaces 304.2 are roughened, a desmear operation is performed in order to prepare the insulator laminate 304.1, and the inner surfaces of the vias 306.1, and 306.2 for plating.

In process 408, the insulator laminate layers 304.1, and the inner surfaces of the vias 306.1, and 306.2 are plated with a metal such as copper. The above described plating may be performed using a chemical plating technology, or by an electrical plating technology, or a combination of both chemical and electrical plating technologies. In process 408, the plating in the vias 306.1, and 306.2 are treated with an oxidizing solution in order to promote good adhesion with plugging materials. In one embodiment, a conventional black or brown oxide may be used.

In process 408, the vias 306.1, and 306.2 are filled with materials to form the precursor Peltier device. For example, in one embodiment, the pin 310 is inserted into the via 306.1, and the pin 312 is inserted into the via 306.2. The process 408 also includes a resin filling operation in order to fill spaces between each pins 310, 312, and an inner wall of the vias 306.1, and 306.2, respectively. Optionally, in one embodiment, before inserting the pins 310, and 312 into the vias 306.1, and 306.2, respectively, solder paste is inserted into the vias 306.1, and 306.2, and a solder operation is performed, in order to ensure good electrical connectivity between each pin 310, 312, and the metallization layer 302.2 (see FIG. 3 of the drawings). In process 408, a buff grinding operation is also performed in order to remove excess resin. Process 408 also includes a lead plating process, in which a top and bottom of each via 306.1, and 306.2 is plated with a lead, for example, of copper.

In process 410, a series of line patterning processes is performed and include acid cleaning, dry film lamination, exposure, development, etching, and removal of dry film to make electrical lines such as the electrical line 302.2.

The steps used to fabricate the second build-up formations 306 of FIG. 3 are conventional and are therefore not described.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

The invention claimed is:

1. A method comprising:
fabricating at least one precursor Peltier cooling device in a substrate, the precursor Pelter cooling device forming a Peltier cooling device in combination with a semiconductor die, when the semiconductor die is subsequently attached to the substrate, wherein fabricating comprises:
forming a core of the substrate sandwiched between two metallization layers;
selectively removing portions of the metallization layers;
depositing insulator laminate layers on both sides of the core;
forming through hole vias extending through the core;
plating the insulating laminate layers and inner surfaces of the through vias with a metal;
filling the through hole vias with materials to form the precursor Peltier device; and
metal-plating a top and bottom of the through hole vias.

2. The method of claim 1, wherein the fabricating comprises fabricating a plurality of precursor Peltier cooling devices in the substrate.

3. The method of claim 2, wherein the plurality of precursor Peltier devices are connectible in series.

4. The method of claim 1, wherein forming the through hole vias comprises forming first and second through holes in the substrate and wherein filling the through hole vias comprises at least partially filling the first and second through holes with P-type and N-type semiconductor material, respectively.

5. The method of claim 4, wherein the P and N-type semiconductor materials are prefabricated in the form of pins of P and N-type semiconductor materials.

6. The method of claim 5, comprising depositing solder paste in the first and second through holes to electrically connect an end of each pin inserted into the first and second through holes, respectively with a metallic line formed in the substrate and connecting the first and second through holes.

7. The method of claim 6, comprising forming a metallic terminal at the end of each pin remote from the end that is inserted into the through hole.

8. The method of claim 5, comprising plugging the first and second through holes with a filling material after inserting the pins.

9. The method of claim 5 comprising:
inserting a first end of a P-type semiconductor pin in a first through hole via in the substrate;
inserting a first end of an N-type semiconductor pin in a second through hole via in the substrate;
electrically connecting the first ends of the P and N-type semiconductor pins with a conductive layer of said substrate;
forming a first structure for electrical contact to a semiconductor die by creating a first conductive bump on said substrate that is electrically connected to a second end of said P-type semiconductor pin; and
forming a second structure for electrical contact to a semiconductor die by creating a second conductive type on said substrate that is electrically connected to a second end of said N-type semiconductor.

10. The method of claim 9, wherein electrically connecting the first ends of the P and N-type semiconductor pins comprises using a solder process to solder each first end to a metallization layer in the substrate.

11. The method of claim 10, further comprising filling a gap between each pin in its respective through hole via with a filler material.

12. The method of claim 11, further comprising forming a pin terminal for each pin at its end remote from the first end.

13. The method of claim 9 further comprising:
inserting a first end of a second P-type semiconductor pin in a third through hole via in said substrate;
inserting a first end of a second N-type semiconductor pin in a fourth through hole via in said substrate;
electrically connecting the first ends of the second P and second N-type semiconductor pins with a said conductive layer of said substrate;
forming a third structure for electrical contact to a semiconductor die by creating a third conductive bump on said substrate that is electrically connected to a second end of said second P-type semiconductor pin; and,
forming a fourth structure for electrical contact to a semiconductor die by creating a fourth conductive bump on said substrate that is electrically connected to a second end of said second N-type semiconductor pin.

14. The method of claim 13 comprising attaching a semiconductor die to said first, second, third and fourth structures.

15. The method of claim 13 further comprising cooling said semiconductor die through a Peltier cooling process by flowing an electrical current through said first N-type semiconductor pin, said first P-type semiconductor pin, a first electrical path within said semiconductor die, said second N-type semiconductor pin, said second P-type semiconductor pin and a second electrical path within said semiconductor die, wherein said current flows through said first electrical path alter said current flows trough said first N-type and P-type semiconductor pins but before said current flows through said second N-type and P-type semiconductor pins, and wherein said current flows through said second electrical path after said current flows through said second N-type and P-type semiconductor pins.

* * * * *